(12) United States Patent
Dhamrin et al.

(10) Patent No.: US 10,916,423 B2
(45) Date of Patent: Feb. 9, 2021

(54) PASTE COMPOSITION AND METHOD FOR FORMING SILICON GERMANIUM LAYER

(71) Applicant: TOYO ALUMINIUM KABUSHIKI KAISHA, Osaka (JP)

(72) Inventors: Marwan Dhamrin, Osaka (JP); Shota Suzuki, Osaka (JP); Ken Kikuchi, Osaka (JP); Masahiro Nakahara, Osaka (JP); Naoya Morishita, Osaka (JP)

(73) Assignee: TOYO ALUMINIUM KABUSHIKI KAISHA, Osaka (JP)

( * ) Notice: Subject to any disclaimer, the term of this patent is extended or adjusted under 35 U.S.C. 154(b) by 398 days.

(21) Appl. No.: 15/762,321

(22) PCT Filed: Sep. 16, 2016

(86) PCT No.: PCT/JP2016/077439
§ 371 (c)(1),
(2) Date: Mar. 22, 2018

(87) PCT Pub. No.: WO2017/051775
PCT Pub. Date: Mar. 30, 2017

(65) Prior Publication Data
US 2018/0301334 A1 Oct. 18, 2018

(30) Foreign Application Priority Data

Sep. 24, 2015 (JP) .................................. 2015-187017

(51) Int. Cl.
*H01L 21/02* (2006.01)
*H01L 21/208* (2006.01)
(Continued)

(52) U.S. Cl.
CPC ......... *H01L 21/02532* (2013.01); *H01B 1/22* (2013.01); *H01L 21/02381* (2013.01);
(Continued)

(58) Field of Classification Search
None
See application file for complete search history.

(56) References Cited

U.S. PATENT DOCUMENTS 10,446,291 B2 * 10/2019 Dhamrin ............... H01L 21/225
2004/0137735 A1 7/2004 Sakai et al.
(Continued)

FOREIGN PATENT DOCUMENTS

JP 5-298917 A 11/1993
JP 9-172204 A 6/1997
(Continued)

OTHER PUBLICATIONS

English translation of JP 2015/153567, Aug. 2015; 36 pages.*
(Continued)

*Primary Examiner* — Helene Klemanski
(74) *Attorney, Agent, or Firm* — Westerman, Hattori, Daniels & Adrian, LLP

(57) ABSTRACT

This invention provides a paste composition that enables a silicon germanium layer to be formed safely and easily, and a method for forming a silicon germanium layer safely and easily. The present invention provides a paste composition for forming a silicon germanium layer, the composition comprising aluminum and germanium, wherein the content of the germanium is more than 1 part by mass and 10000 parts by mass or less, per 100 parts by mass of the aluminum.

5 Claims, 5 Drawing Sheets

(51) Int. Cl.
  *H01L 21/20* (2006.01)
  *H01B 1/22* (2006.01)
  *H01L 21/324* (2006.01)
  *C09D 11/52* (2014.01)

(52) U.S. Cl.
  CPC .. *H01L 21/02625* (2013.01); *H01L 21/02628* (2013.01); *H01L 21/20* (2013.01); *H01L 21/208* (2013.01); *H01L 21/324* (2013.01)

(56) References Cited

U.S. PATENT DOCUMENTS

| | | | | |
|---|---|---|---|---|
| 2009/0134767 | A1* | 5/2009 | Cho | H01J 11/12 313/326 |
| 2010/0126565 | A1* | 5/2010 | Takeda | C03C 8/18 136/252 |
| 2010/0252111 | A1* | 10/2010 | Kikuchi | H01B 1/023 136/261 |
| 2011/0097881 | A1 | 4/2011 | Vandervorst et al. | |
| 2011/0192457 | A1 | 8/2011 | Nakayama et al. | |
| 2011/0318905 | A1* | 12/2011 | Chiruvolu | C09D 11/52 438/478 |
| 2012/0064291 | A1* | 3/2012 | Lai | H05K 1/092 428/141 |
| 2012/0103414 | A1* | 5/2012 | Ishibashi | H01L 31/022425 136/256 |
| 2012/0152342 | A1 | 6/2012 | Roelofs | |
| 2012/0174974 | A1 | 7/2012 | Khadilkar et al. | |
| 2015/0020880 | A1 | 1/2015 | Nakayama et al. | |
| 2015/0090325 | A1 | 4/2015 | Sewell et al. | |
| 2017/0141248 | A1* | 5/2017 | Song | C09D 11/033 |
| 2018/0218801 | A1* | 8/2018 | Dhamrin | H01L 31/1804 |

FOREIGN PATENT DOCUMENTS

| | | |
|---|---|---|
| JP | 2004-18946 A | 1/2004 |
| JP | 2004-172276 A | 6/2004 |
| JP | 2011-146684 A | 7/2011 |
| JP | 2015-122506 A | 7/2015 |
| JP | 2015-153567 A | 8/2015 |
| TW | 201337958 A | 9/2013 |

OTHER PUBLICATIONS

English translation of JP 09/172204, Jun. 1997; 24 pages.*
English translation of JP 05/298917, Nov. 1993; 7 pages.*
International Search Report dated Dec. 6, 2016, issued in counterpart International Application No. PCT/JP2016/077439 (2 pages).
Extended (supplementary) European Search Report dated Apr. 18, 2019, issued in counterpart EP Application No. 16848563.9. (9 pages).

* cited by examiner

PASTE COMPOSITION AND METHOD FOR FORMING SILICON GERMANIUM LAYER

TECHNICAL FIELD

The present invention relates to a paste composition and a method for forming a silicon germanium layer.

BACKGROUND ART

Silicon germanium (Si—Ge), which is a mixed crystal material of silicon and germanium, has been used as a semiconductor material. Such a semiconductor material is formed as a silicon germanium layer on a substrate, such as silicon, and used as a part of a transistor or a diode.

Disclosed as methods for forming a silicon germanium layer are a method in which epitaxial growth is performed by chemical vapor deposition (CVD) (see PTL 1), a method in which epitaxial growth is performed by molecular beam epitaxy (MBE) (see PTL 2), and a method in which a film is formed by sputtering using an Si—Ge-based alloy target (see PTL 3).

However, the methods disclosed in PTL 1 and PTL 2 are problematic in that they require the use of a hazardous gas, such as $SiH_4$ or $GeH_4$.

Further, the methods disclosed in PTL 1 to PTL 3 are problematic in that the process of performing epitaxial growth and the process of forming a film by sputtering require a long period of time because of the need for the use of a vacuum apparatus in these processes.

Therefore, there is a demand for the development of a method for forming a silicon germanium layer safely and easily. The development of a paste composition used for the method is also in demand.

CITATION LIST

Patent Literature

PTL 1: JP2011-146684A
PTL 2: JP2004-172276A
PTL 3: JP2004-018946A

SUMMARY OF INVENTION

Technical Problem

An object of the present invention is to provide a paste composition that enables a silicon germanium layer to be formed safely and easily, and a method for forming a silicon germanium layer safely and easily.

Solution to Problem

The present inventors conducted extensive research to achieve the object, and found that a paste composition comprising aluminum and germanium in which the content of the germanium relative to the aluminum is within a specific range can achieve the object. The present invention has thus been accomplished.

More specifically, the present invention provides the following paste composition and method for forming a silicon germanium layer.
1. A paste composition for forming a silicon germanium layer, the composition comprising aluminum and germanium, wherein the content of the germanium is more than 1 part by mass and 10000 parts by mass or less, per 100 parts by mass of the aluminum.
2. The paste composition according to Item 1, which further comprises a resin component.
3. The paste composition according to Item 2, wherein the content of the resin component is 0.1 to 10 parts by mass, per 100 parts by mass of the aluminum.
4. The paste composition according to any one of Items 1 to 3, which further comprises a glass component.
5. The paste composition according to Item 4, wherein the content of the glass component is 0.01 to 3 parts by mass, per 100 parts by mass of the aluminum.
6. A method for forming a silicon germanium layer, the method comprising the steps of:
(1) step 1 of applying a paste composition to a silicon-containing substrate, the paste composition comprising aluminum and germanium, wherein the content of the germanium is more than 1 part by mass and 10000 parts by mass or less, per 100 parts by mass of the aluminum; and
(2) step 2 of sintering the substrate to which the paste composition is applied.
7. The method according to Item 6, wherein the sintering is performed at a temperature of 500 to 1000° C.

Advantageous Effects of Invention

The paste composition of the present invention comprises aluminum and germanium, and the content of the germanium relative to the aluminum is within a specific range. Owing to these features, a silicon germanium layer can be formed safely and easily by applying the composition to a substrate and heating the resulting substrate.

Moreover, in the method for forming a silicon germanium layer of the present invention, a silicon germanium layer can be formed by applying the paste composition to a substrate and heating the resulting substrate. Thus, the method for forming a silicon germanium layer of the present invention enables a silicon germanium layer to be formed safely and easily.

DESCRIPTION OF EMBODIMENTS

Figure 1:
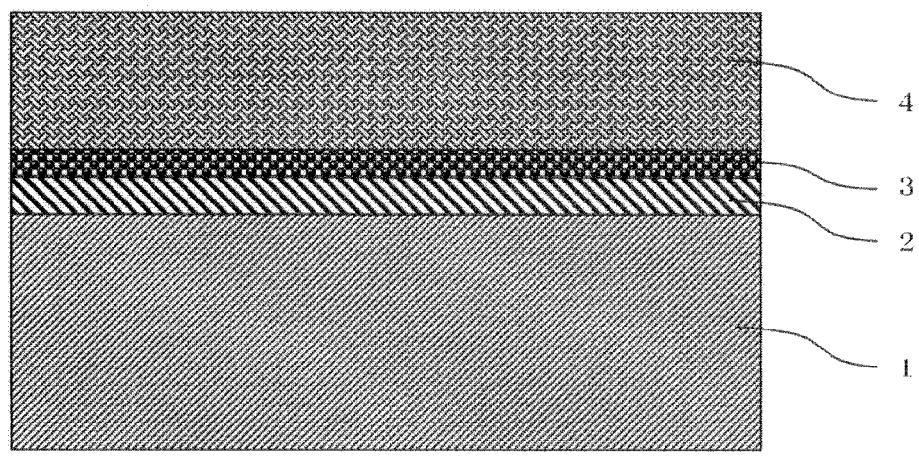
FIG. 1 is a cross-sectional view schematically illustrating an example of a state after performing steps 1 and 2 of the method according to the present invention.

The paste composition of the present invention is a paste composition for forming a silicon germanium layer, the composition comprising aluminum and germanium, wherein the content of the germanium is more than 1 part by mass and 10000 parts by mass or less, per 100 parts by mass of the aluminum.

The paste composition of the present invention, which has the above features, is applied to a silicon-containing substrate, such as a silicon wafer, by an application method, such as screen printing, and the resulting substrate is heated. Thereby, the silicon contained in the silicon-containing substrate forms an alloy with the aluminum and the germanium in the paste composition. When the temperature drops after the completion of heating, the alloy recrystallizes to form a silicon germanium layer on the silicon-containing substrate. Since a silicon germanium layer can be formed by applying the paste composition of the present invention to a silicon-containing substrate and heating the resulting substrate, it is not necessary that a hazardous gas, such as $SiH_4$ or $GeH_4$, be used, nor is it necessary that equipment such as a vacuum apparatus be used. Thus, a silicon germanium layer can be formed safely and easily without requiring a long period of time.

The paste composition of the present invention and the method for forming a silicon germanium layer of the present invention are explained in detail below.

1. Paste Composition

The paste composition of the present invention is a paste composition for forming a silicon germanium layer, the composition comprising aluminum and germanium, wherein the content of the germanium is more than 1 part by mass and 10000 parts by mass or less, per 100 parts by mass of the aluminum.

Aluminum

Aluminum is not particularly limited as long as it is in a form that can be contained in the paste composition. Examples include an aluminum powder.

The aluminum powder preferably has an aluminum content of 99.0 mass % or more, and more preferably 99.9 mass % or more. The aluminum powder may be an aluminum alloy powder containing, in addition to aluminum, other metal. Examples of the aluminum alloy powder include a powder of an alloy containing at least one element selected from the group consisting of iron, copper, manganese, magnesium, chromium, zinc, titanium, vanadium, gallium, nickel, boron, and zirconium. The content of each of such elements is preferably 1000 ppm or less, and particularly preferably 300 ppm or less, based on the total amount of the aluminum alloy powder.

The shape of the aluminum powder is not particularly limited and may have any shape, such as spherical, elliptical, amorphous, scaly, fibrous, and like shapes. Among these, an aluminum powder having a spherical shape is preferable from the viewpoint of excellent printability and excellent reactivity with silicon.

The average particle size ($D_{50}$) of the aluminum powder is preferably 1 to 20 μm, more preferably 1 to 10 μm, and even more preferably 1 to 5 μm. When the average particle size of the aluminum powder is within this range, the aluminum powder has more excellent reactivity with silicon, and the printability of the paste composition is increased.

The average particle size ($D_{50}$) as used herein refers to a value obtained by using laser diffractometry. More specifically, the average particle size refers to a particle size corresponding to 50% (median value) of all the particles in a particle size distribution curve that is obtained by finding a particle size and the number of particles having the particle size.

The content of the aluminum in the paste composition is not particularly limited and is preferably 5 to 80 mass %, and more preferably 6 to 65 mass %, based on the paste composition taken as 100 mass %. When the content of the aluminum is within this range, the reactivity of the aluminum with silicon is more excellent, and thereby the reactivity of the germanium with silicon is enhanced, which enables a silicon germanium layer to be formed more easily.

Germanium

Germanium is not particularly limited as long as it is in a form that can be contained in the paste composition. Examples include a germanium powder.

The germanium powder preferably has a germanium purity of 98.0 mass % or more. The germanium powder may be a germanium alloy powder containing, in addition to germanium, other metal. Examples of the germanium alloy powder include a powder of an alloy containing at least one element selected from the group consisting of iron, copper, manganese, magnesium, chromium, zinc, titanium, vanadium, gallium, nickel, boron, and zirconium. The content of each of such elements is preferably 1000 mass ppm or less, and particularly preferably 300 mass ppm or less, based on the total amount of the germanium alloy powder.

The shape of the germanium powder is not particularly limited and may have any shape, such as spherical, elliptical, amorphous, scaly, fibrous, and like shapes. Of these, a germanium powder having a spherical shape is preferable from the viewpoint of excellent printability and excellent reactivity with silicon.

The average particle size ($D_{50}$) of the germanium powder is preferably 1 to 20 μm, more preferably 1 to 10 μm, and even more preferably 1 to 5 μm. When the average particle size of the germanium powder is within this range, the germanium powder has more excellent reactivity with silicon, and the printability of the paste composition is increased.

The content of the germanium is more than 1 part by mass and 10000 parts by mass or less, per 100 parts by mass of the aluminum. If the content of the germanium is 1 part by mass or less, the formation of a silicon germanium layer is prevented. If the content of the germanium is more than 10000 parts by mass, the reaction of the aluminum, which has a lower melting point than the germanium, with silicon is hindered, and thus the reactivity is reduced, which prevents the formation of a silicon germanium layer. The content of the germanium is preferably 50 parts by mass or more, and more preferably 100 parts by mass or more. The content of the germanium is also preferably 10000 parts by mass or less, and more preferably 5000 parts by mass or less.

Glass Component

The paste composition of the present invention may comprise a glass component. When the paste composition comprises a glass powder, the reactivity of the aluminum with silicon is more excellent, and thereby the reactivity of the germanium with silicon is enhanced, which enables a silicon germanium layer to be formed more easily.

The glass component preferably contains at least one member selected from the group consisting of alkali metals and alkaline earth metals. More specifically, the glass component preferably contains an oxide of at least one member selected from the group consisting of lithium, sodium, and potassium, which belong to alkali metals, and calcium, magnesium, strontium, and barium, which belong to alkaline earth metals. Also, the glass component may comprise one or two or more members selected from the group consisting of Pb, Bi, V, B, Si, Sn, P, and Zn. Further, a lead-containing glass component or a lead-free glass component, such as a bismuth-based, vanadium-based, tin-phosphorus-based, zinc borosilicate-based, or alkali borosilicate-based glass component, may be used. Especially in view of the influence on the human body, it is desirable to use a lead-free glass component.

The softening point of the glass component is preferably 300 to 700° C., and more preferably 400 to 600° C. When the softening point of the glass component is within this range, the reaction of the aluminum with silicon is further accelerated, and thereby the reactivity of the germanium with silicon is enhanced, which enables a silicon germanium layer to be formed more easily.

The glass component is not particularly limited as long as it is in a form that can be contained in the paste composition. Examples include a glass powder. The glass powder preferably has an average particle size of 1 to 8 μm, and more preferably 2 to 4 μm. When the average particle size of the glass powder is too small, the glass powder may aggregate during dispersion of the paste. When the average particle size of the glass powder is too large, the formation of a silicon germanium layer may be prevented.

The content of the glass component is not particularly limited and is preferably 0.1 to 3 parts by mass, and more preferably 0.1 to 1 part by mass, per 100 parts by mass of the total amount of the aluminum and the germanium. When the content of the glass component is within this range, the reactivity of the aluminum with silicon is more excellent, and thereby the reactivity of the germanium with silicon is enhanced, which enables a silicon germanium layer to be formed more easily.

Resin Component

The paste composition of the present invention may comprise a resin component. When the paste composition comprises a resin component, the stability and printability of the paste composition can be increased.

A resin that is usable as the resin component is not particularly limited, and hitherto-known resins can be used. Examples of such resins include ethyl cellulose, nitrocellulose, polyvinyl butyral, phenol resins, melanin resins, urea resins, xylene resins, alkyd resins, unsaturated polyester resins, acrylic resins, polyimide resins, furan resins, urethane resins, isocyanate compounds, cyanate compounds, and like thermosetting resins, polyethylene, polypropylene, polystyrene, ABS resins, polymethyl methacrylate, polyvinyl chloride, polyvinylidene chloride, polyvinyl acetate, polyvinyl alcohol, polyacetal, polycarbonate, polyethylene terephthalate, polybutylene terephthalate, polyphenylene oxide, polysulfone, polyimide, polyether sulfone, polyarylate, polyetheretherketone, polytetrafluoroethylene, silicone resins, and the like. Among these, ethyl cellulose is preferable in that more excellent stability and printability of the paste composition are obtained. These resins may be used singly or in a combination of two or more.

The melting point of the resin component is preferably 100 to 300° C., and more preferably 150 to 300° C. When the melting point of the resin component is within this range, the reaction of the aluminum with silicon is further accelerated, and thereby the reactivity of the germanium with silicon is enhanced, which enables a silicon germanium layer to be formed more easily.

The content of the resin component is not particularly limited and is preferably 0.1 to 10 parts by mass, and more preferably 0.5 to 7.5 parts by mass, per 100 parts by mass of the aluminum. When the content of the resin component is within this range, the stability and the printability of the paste composition can be enhanced.

Dispersion Medium

The paste composition of the present invention may comprise a dispersion medium. When the paste composition comprises a dispersion medium, the printability of the paste composition can be increased.

The dispersion medium is not particularly limited as long as the aluminum and the germanium can be dispersed. Water, a solvent, etc., may be used. The paste composition of the present invention may be in a form in which the aluminum and the germanium are dispersed in water and/or a solvent, or may be in a form that contains the aluminum, the germanium, and an organic vehicle in which the resin component described above is dissolved in a solvent.

Known solvents are usable as solvents. Specific examples include diethylene glycol monobutyl ether, diethylene glycol monobutyl ether acetate, dipropylene glycol monomethyl ether, terpineol, and the like. Of these, diethylene glycol monobutyl ether and terpineol are preferable in view of dispersibility and printability.

These dispersion mediums may be used singly or in a combination of two or more.

The content of the dispersion medium is not particularly limited and is preferably 1 to 30 mass %, and more preferably 5 to 15 mass %, based on the paste composition taken as 100 mass %. When the content of the dispersion medium is within the above range, the stability and printability of the paste composition are further enhanced.

Other Additives

The paste composition of the present invention may comprise, in addition to the above-mentioned aluminum, germanium, glass component, resin component, and dispersion medium, one or more other additives. Such additives are not particularly limited as long as the effects of the present invention are not impaired. Examples include antioxidants, corrosion inhibitors, defoamers, thickeners (tackifiers), coupling agents, electrostatic imparting agents, polymerization inhibitors, thixotropic agents, antisettling agents, and the like. Specific examples include polyethylene glycol ester compounds, polyoxyethylene sorbitan ester compounds, sorbitan alkyl ester compounds, aliphatic polycarboxylic acid compounds, phosphoric acid ester compounds, amideamine salts of polyester acids, polyethylene oxide compounds, fatty acid amide waxes, and the like.

The content of each of such other additives is not particularly limited and is preferably about 0.01 to 2 parts by mass, per 100 parts by mass of the aluminum.

The paste composition of the present invention preferably has a viscosity of 5 to 100 Pa's, and more preferably 10 to 40 Pa's. When the viscosity of the paste composition is within this range, the paste composition has excellent printability. In the present specification, the viscosity means a value obtained using a rotational viscometer (Brookfield DV2T) with spindle CP-51 at a rotation speed of 2.5 rpm.

A method for producing the paste composition of the present invention is not particularly limited, and the components may be stirred and mixed according to a hitherto-known method. For example, the paste composition can be produced by a method in which the aluminum and the germanium are added to the dispersion medium, and, if necessary, the glass component, the resin component, and one or more other additives are added thereto, followed by stirring and mixing at room temperature.

2. Method for Forming Silicon Germanium Layer

The method for forming a silicon germanium layer of the present invention is a method comprising the following steps 1 and 2:

(1) step 1 of applying a paste composition to a silicon-containing substrate, the paste composition comprising aluminum and germanium, wherein the content of the germanium is more than 1 part by mass and 10000 parts by mass or less, per 100 parts by mass of the aluminum; and
(2) step 2 of sintering the silicon-containing substrate to which the paste composition is applied.

The following describes the details.

Step 1

Step 1 is a step of applying a paste composition to a silicon-containing substrate, the paste composition comprising aluminum and germanium, wherein the content of the germanium is more than 1 part by mass and 10000 parts by mass or less, per 100 parts by mass of the aluminum.

As the paste composition, the paste composition described above can be used.

The silicon-containing substrate is not particularly limited as long as it contains silicon. Examples include a silicon substrate. As the silicon substrate, a substrate obtained by slicing a silicon ingot can be used. The silicon substrate preferably has a silicon content of 99.0 mass % or more, and more preferably 99.99 mass % or more.

The silicon substrate may contain, in addition to silicon, one or more other elements as impurities or additives. Examples of such other elements include boron, phosphorus, gallium, aluminum, which are semiconductor dopants, and oxygen, nitrogen, carbon, iron, and other elements, which may be included in a production process for a silicon ingot. The concentration of each of such other elements is preferably 100 ppm or less.

The thickness of the silicon-containing substrate is preferably 50 to 600 μm, and more preferably 150 to 300 μm.

A method for applying the paste composition to the silicon-containing substrate is not particularly limited. Examples include application methods, such as spin coating and inkjet printing. The application method includes, for example, dip coating, known roll coating methods, and the like. Specific examples include air doctor coating, blade coating, rod coating, extrusion coating, air knife coating, squeeze coating, impregnation coating, reverse roll coating, transfer roll coating, gravure coating, kiss coating, cast coating, spray coating, and the like. Also, the application method includes printing methods in which the optimum viscosity region is in a relatively low viscosity region, such as intaglio printing, and printing methods in which the optimum viscosity region is in a relatively high viscosity region, such as screen printing. Specific examples include a stencil printing method, an intaglio printing method, a planography method, and the like.

The amount of the paste composition applied to the silicon-containing substrate is preferably 4 to 12 mg/cm$^2$, and more preferably 6 to 8 mg/cm$^2$.

In step 1 described above, the paste composition is applied to the silicon-containing substrate.

Step 2

Step 2 is a step of sintering the silicon-containing substrate to which the paste composition is applied.

There is no limitation on the sintering conditions, and sintering may be performed in an air atmosphere or an inert gas atmosphere, such as nitrogen.

The sintering temperature is preferably 500 to 1000° C., more preferably 600 to 1000° C., and even more preferably 850 to 950° C. Performing sintering at a sintering temperature within this range enables sufficient formation of a silicon germanium layer.

The sintering time is preferably 3 to 600 seconds, and more preferably 5 to 300 seconds. The sintering time within this range enables sufficient formation of a silicon germanium layer. The sintering time may be adjusted according to the sintering temperature. Shortening the sintering time by setting the sintering temperature at a high temperature is preferable in terms of excellent production efficiency.

CVD growth and sputtering, which are hitherto-known techniques, require the use of a vacuum apparatus. Thus, these known techniques require an evacuation step for 5 minutes or more and further a film forming step for a few minutes to a few hours depending on the thickness of a silicon germanium layer to be formed, in order to form the silicon germanium layer. However, the method for forming a silicon germanium layer of the present invention does not require the use of a vacuum apparatus and enables the formation of a silicon germanium layer in the sintering time range described above.

When the temperature drops after the sintering step, the alloy recrystallizes to form a silicon germanium layer on the silicon-containing substrate. In step 2, the substrate may be cooled after sintering. The cooling rate during the cooling is preferably 1 to 30° C./s, and more preferably 10 to 20° C./s.

Preheating Step

The method for forming a silicon germanium layer of the present invention may comprise, between step 1 and step 2, a preheating step for removing the resin component etc. from the paste composition applied to the silicon-containing substrate. By including the preheating step, the resin component present in the paste composition can be removed, and the dispersion medium can also be removed; therefore, a silicon germanium layer can be formed more sufficiently.

There is no limitation on the preheating conditions, and preheating may be carried out by heating in an air atmosphere or an inert gas atmosphere, such as nitrogen, according to a hitherto-known method.

The preheating temperature is preferably 300 to 500° C., and more preferably 400 to 500° C. The preheating time is preferably 20 to 600 seconds, and more preferably 20 to 60 seconds.

Drying Step

The method for forming a silicon germanium layer of the present invention may comprise, before the preheating step, a drying step of drying the paste composition applied to the silicon-containing substrate. By including the drying step, the dispersion medium present in the paste composition can be removed to a certain extent beforehand, and thus a silicon germanium layer can be formed more sufficiently.

There is no limitation on the drying conditions, and the composition may be dried by heating in an air atmosphere or an inert gas atmosphere, such as nitrogen, according to a hitherto-known method.

The drying temperature is preferably 100 to 400° C., and more preferably 100 to 200° C. The drying time is preferably 20 to 600 seconds, and more preferably 60 to 300 seconds.

Figure 2:
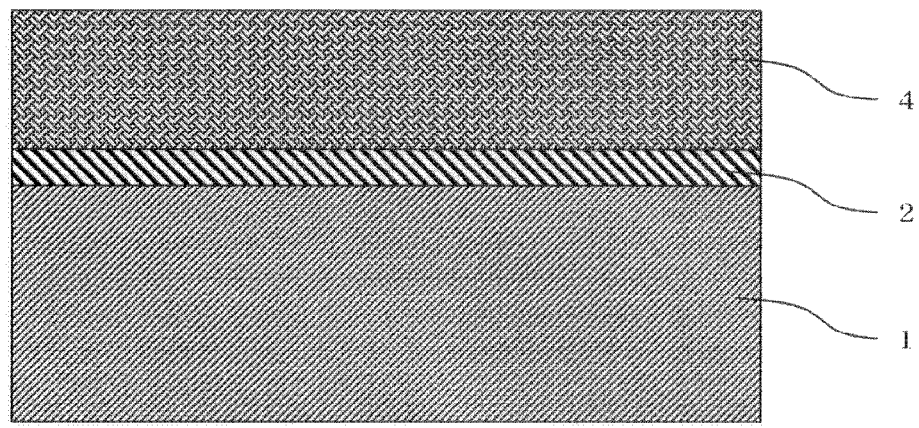
FIG. 2 is a cross-sectional view schematically illustrating an example of a state after performing steps 1 and 2 of the method according to the present invention.

As shown in FIG. 1 or 2, a silicon germanium layer is formed on a silicon-containing substrate by performing steps 1 and 2 described above.

FIGS. 1 and 2 are cross-sectional views schematically illustrating an example of a state after performing steps 1 and 2. In FIG. 1, a silicon germanium layer (Si—Ge layer) 2 is formed on a silicon-containing substrate 1. On the silicon germanium layer 2, an aluminum-silicon germanium layer (Al—Si—Ge layer) 3 and an aluminum germanium sintered body layer (Al—Ge sintered body layer) 4 are further formed as unwanted layers.

In FIG. 2, a silicon germanium layer (Si—Ge layer) 2 is formed on a silicon-containing substrate 1. On the silicon germanium layer 2, an aluminum germanium sintered body layer (Al—Ge sintered body layer) 4 is further formed as an unwanted layer.

It depends on the conditions, such as the ratio of the germanium to the aluminum in the paste composition and the sintering temperature in step 2, whether the layer structure obtained after performing steps 1 and 2 becomes a layer structure in which the aluminum-silicon germanium layer (Al—Si—Ge layer) 3 and the aluminum germanium sintered body layer (Al—Ge sintered body layer) 4 are formed on the silicon germanium layer 2 as shown in FIG. 1, or a layer structure in which the aluminum germanium sintered body layer (Al—Ge sintered body layer) 4 is formed on the silicon germanium layer 2 as shown in FIG. 2.

Removing Step

The method for forming a silicon germanium layer of the present invention may comprise, after step 2, a step of removing one or more unwanted layers formed on the silicon germanium layer in step 2, such as the aluminum-silicon germanium layer (Al—Si—Ge layer) and the aluminum germanium sintered body layer (Al—Ge sintered body layer).

A method for removing the unwanted layers is not particularly limited, and the unwanted layers may be removed by a hitherto-known method. Examples of such methods include acid or alkaline etching; abrading with a coated abrasive; abrading with silicon oxide abrasive grains, aluminum oxide abrasive grains, diamond abrasive grains, or the like; and the like.

EXAMPLES

The present invention is explained in detail below with reference to Examples and Comparative Examples; however, the present invention is not limited to these Examples.

Example 1

The following starting materials were prepared.

Aluminum powder: produced by Toyo Aluminium K.K.; a spherical powder with an aluminum content of 99.9 mass % and an average particle size of 4 μm Germanium powder: Ge Powder (produced by Furuuchi Chemical Corporation; a non-spherical powder with a germanium content of 99.999 mass % and an average particle size of 10 μm)

Resin component: ethyl cellulose resin (produced by Dow)

A paste composition was prepared using the above starting materials. Specifically, the composition was prepared by adding 47 parts by weight of the germanium powder, 1 part by mass of the ethyl cellulose resin as the resin component, and 15 parts by mass of a diethylene glycol monobutyl ether as a dispersion medium to 100 parts by mass of the aluminum powder.

The paste composition prepared was applied in an amount of 7 mg/cm$^2$ to a p-type silicon substrate to a thickness of 180 μm.

Subsequently, after the dispersion medium was removed by drying at 100° C. for 3 minutes, preheating was carried out at a temperature of 400° C. for 20 seconds to remove organic matter, and sintering was performed by heating at a temperature of 860° C. for 5 seconds to form a silicon germanium layer (Si—Ge layer), an aluminum-silicon germanium layer (Al—Si—Ge layer), and an aluminum germanium sintered body layer (Al—Ge sintered body layer) in this order from below on the p-type silicon substrate, thereby obtaining a laminate of these layers.

The cross section of the obtained laminate was observed and subjected to elemental mapping using a scanning electron microscope (SEM) and an energy dispersive X-ray spectrometer (EDS) (produced by JEOL Ltd., model: JSM-6510). The results confirmed that a silicon germanium layer (Si—Ge layer), an aluminum-silicon germanium layer (Al—Si—Ge layer), and an aluminum germanium sintered body layer (Al—Ge sintered body layer) were formed. The thickness of the silicon germanium layer was 7.3 μm.

Finally, the aluminum-silicon germanium layer (Al—Si—Ge layer) and the aluminum germanium sintered body layer (Al—Ge sintered body layer) were removed by acid etching by immersion in 25% hydrochloric acid. Thereby, a laminate in which a silicon germanium layer (Si—Ge layer) was formed on a p-type silicon substrate was produced.

Example 2

A laminate in which a silicon germanium layer (Si—Ge layer) was formed on a p-type silicon substrate was produced in the same manner as in Example 1, except that the preheating time was 300 seconds and that sintering was performed for a heating time of 300 seconds.

As in Example 1, it was confirmed that a silicon germanium layer (Si—Ge layer), an aluminum-silicon germanium layer (Al—Si—Ge layer), and an aluminum germanium sintered body layer (Al—Ge sintered body layer) were formed in this order from below on a p-type silicon substrate by sintering. The thickness of the silicon germanium layer varied depending on the measurement point, and the maximum thickness was 16.0 μm.

Example 3

A paste composition was prepared in the same manner as in Example 1, except that the amount of the germanium powder was 9 parts by mass, per 100 parts by mass of the aluminum powder, and a laminate in which a silicon germanium layer (Si—Ge layer) was formed on a p-type silicon substrate was produced.

As in Example 1, it was confirmed that a silicon germanium layer (Si—Ge layer), an aluminum-silicon germanium layer (Al—Si—Ge layer), and an aluminum germanium sintered body layer (Al—Ge sintered body layer) were formed in this order from below on a p-type silicon substrate by sintering. The thickness of the silicon germanium layer varied depending on the measurement point, and the maximum thickness was 4.9 μm.

Example 4

A paste composition was prepared in the same manner as in Example 1, except that the amount of the germanium powder was 100 parts by mass, per 100 parts by mass of the aluminum powder, that the amount of the resin component was 1.4 parts by mass, and that the amount of the solvent was 20 parts by mass, and a laminate in which a silicon germanium layer (Si—Ge layer) was formed on a p-type silicon substrate was produced.

It was confirmed that a silicon germanium layer (Si—Ge layer) and an aluminum germanium sintered body layer (Al—Ge sintered body layer) were formed in this order from below on a p-type silicon substrate by sintering. The thickness of the silicon germanium layer varied depending on the measurement point, and the maximum thickness was 8.5 µm.

Example 5

A paste composition was prepared in the same manner as in Example 1, except that the amount of the germanium powder was 1000 parts by mass per 100 parts by mass of the aluminum powder, that the amount of the resin component was 7.5 parts by mass, and that the amount of the solvent was 112 parts by mass, and a laminate in which a silicon germanium layer (Si—Ge layer) was formed on a p-type silicon substrate was produced.

It was confirmed that a silicon germanium layer (Si—Ge layer) and an aluminum germanium sintered body layer (Al—Ge sintered body layer) were formed in this order from below on a p-type silicon substrate by sintering. The thickness of the silicon germanium layer varied depending on the measurement point, and the maximum thickness was 5.2 µm.

Comparative Example 1

A paste composition was prepared in the same manner as in Example 1, except that the amount of the germanium powder was 1 part by mass per 100 parts by mass of the aluminum powder, and a laminate was produced.

It was confirmed that only an aluminum germanium sintered body layer (Al—Ge sintered body layer) was formed on a p-type silicon substrate by sintering. Formation of a silicon germanium layer was not confirmed.

Table 1 shows the results.

vacuum apparatus, the method for forming a silicon germanium layer of the present invention enables continuous processing of a printing step and a sintering step, thus achieving excellent production efficiency.

To confirm the formation of a silicon germanium layer and the properties thereof, the following analysis was performed.

Preparation of Laminate for Measurement

In the same manner as in Example 4, a silicon germanium layer (Si—Ge layer) and an aluminum germanium sintered body layer (Al—Ge sintered body layer) were formed in this order from below on a p-type silicon substrate by sintering, thereby obtaining a laminate of these layers.

Subsequently, the surface was abraded to remove the aluminum germanium sintered body layer, thereby preparing a laminate for measurement in which a silicon germanium layer was formed on a p-type silicon substrate.

SEM Observation and EDS Elemental Detection

Figure 3:
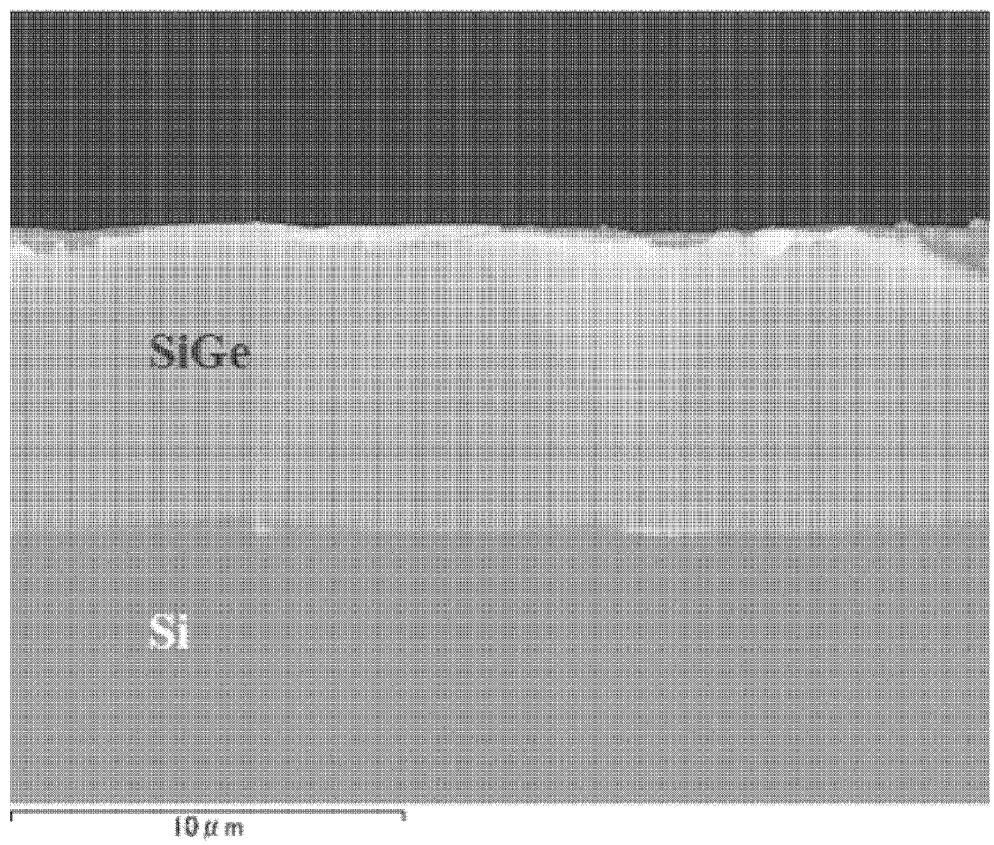
FIG. 3 shows an SEM image of the cross section of a sample for measurement prepared using a silicon germanium layer formed by the method according to the present invention.

The laminate for measurement described above was cut by ion milling in a direction perpendicular to the surface of the laminate for measurement to prepare a sample for measurement. The cross section of the sample for measurement was observed and subjected to elemental mapping using a scanning electron microscope (SEM) and an energy dispersive X-ray spectrometer (EDS) (produced by JEOL Ltd., model: JSM-6510). FIG. 3 shows an SEM image of the cross section of the sample for measurement, and FIG. 4 shows an image obtained by EDS elemental detection.

Figure 4:
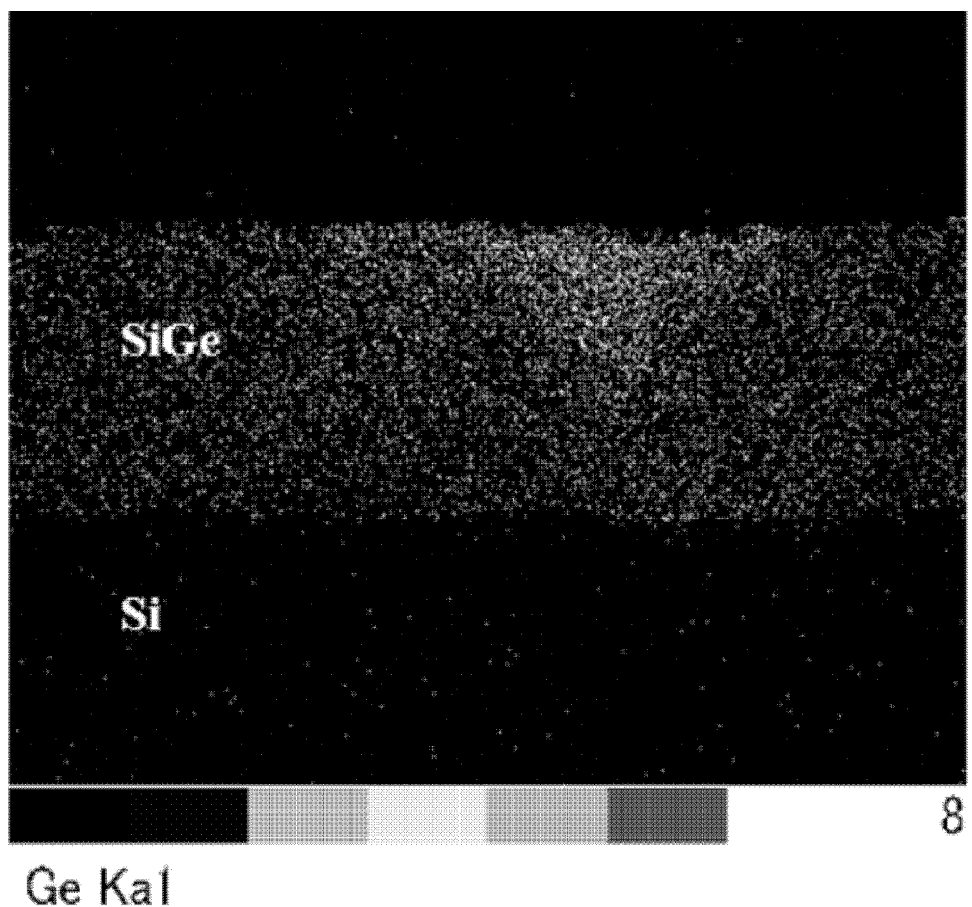
FIG. 4 shows an image of the cross section of a sample for measurement obtained by EDS elemental detection. The sample for measurement was prepared using a silicon germanium layer formed by the method according to the present invention.

From the results shown in FIGS. 3 and 4, the formation of a silicon germanium layer on a p-type silicon substrate can be visually confirmed.

TABLE 1

| Paste composition (parts by mass) | Example 1 | Example 2 | Example 3 | Example 4 | Example 5 | Comparative Example 1 |
| --- | --- | --- | --- | --- | --- | --- |
| Aluminum | 100 | 100 | 100 | 100 | 100 | 100 |
| Germanium | 47 | 47 | 9 | 100 | 1000 | 1 |
| Resin component | 1 | 1 | 1 | 1.4 | 7.5 | 1 |
| Solvent | 15 | 15 | 15 | 20 | 112 | 15 |
| Preheating time (seconds) | 20 | 300 | 20 | 20 | 20 | 20 |
| Sintering time (seconds) | 5 | 300 | 5 | 5 | 5 | 5 |
| Formation of Si—Ge layer | Formed | Formed | Formed | Formed | Formed | Not formed |
| Maximum thickness of Si—Ge layer (µm) | 7.3 | 16.0 | 4.9 | 8.5 | 5.2 | — |

The results shown in Table 1 revealed that the thickness of the silicon germanium layer can be controlled by changing the content of the germanium per 100 parts by mass of the aluminum in the paste composition or the sintering time. Thus, a silicon germanium layer having a required thickness can be formed by the method for forming a silicon germanium layer of the present invention, in applications in which the required thickness of the silicon germanium layer varies, for example, 10 to 100 nm in transistors for ICs and 1 to 100 µm in single transistor devices.

Figure 5:
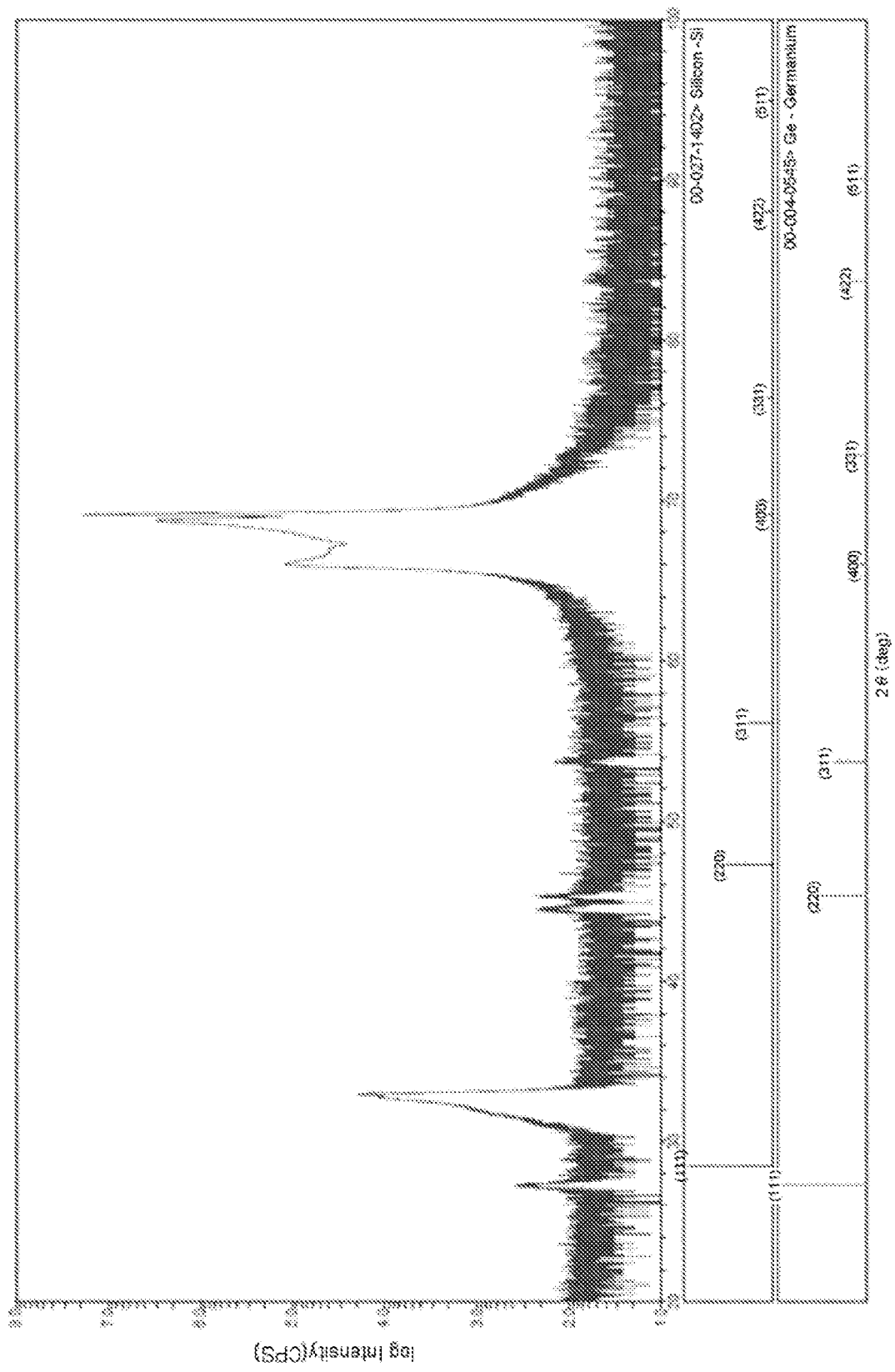
FIG. 5 shows the XRD measurement results of a laminate for measurement prepared using a silicon germanium layer formed by the method according to the present invention.

The results shown in Table 1 also revealed that a silicon germanium layer can be formed by applying the paste composition of the present invention and sintering for a time as short as 10 to 300 seconds. Thus, in contrast to hitherto known techniques, which require batch processing in a XRD Measurement The surface of the laminate for measurement was subjected to X-ray diffraction (XRD) measurement using an X-ray diffractometer (produced by Rigaku Corporation, product name: SmartLab) to measure the plane orientation of the silicon germanium layer formed. FIG. 5 shows the results of the XRD measurement.

The results shown in FIG. 5 revealed that a peak of a (400) orientation believed to be derived from silicon germanium was detected from around 2θ=66.2 deg to around 66.8 deg, and that a silicon germanium layer was believed to be epitaxially grown on a Si(100) substrate.

SIMS Measurement

Figure 6:
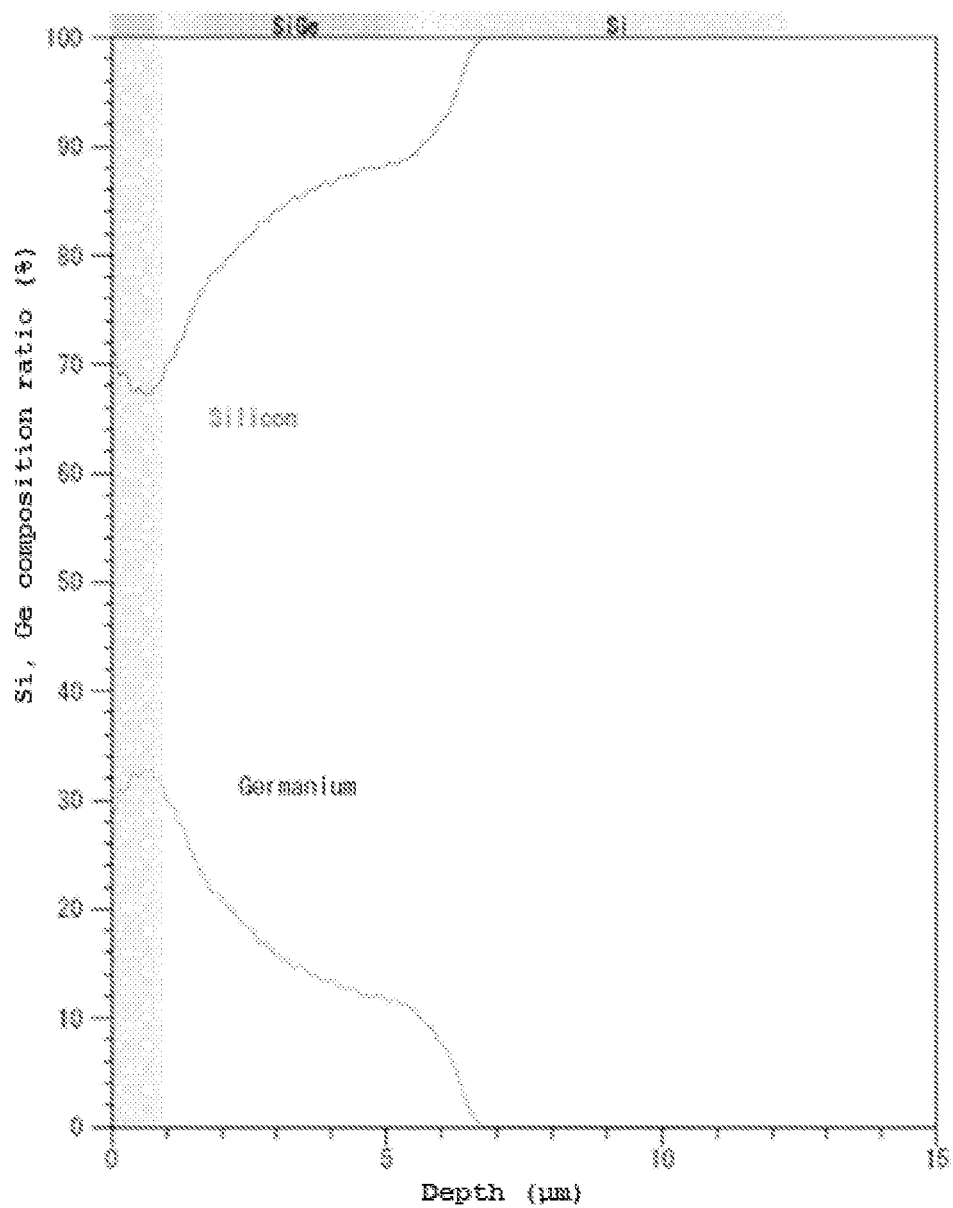
FIG. 6 shows the SIMS measurement results of a laminate for measurement prepared using a silicon germanium layer formed by the method according to the present invention.

The concentration of germanium in the silicon germanium layer of the laminate for measurement described above was measured by secondary ion mass spectrometry (SIMS) with a secondary ion mass spectrometer (produced by Ametek, Inc, Cameca SAS, product name: IMS-7f). The measurement was carried out by measuring the impurity concentration in the depth direction in the case where the surface of the silicon germanium layer was regarded as 0 μm. FIG. 6 shows the results.

The results shown in FIG. 6 confirmed that, near the surface of the silicon germanium layer, a silicon germanium layer having a germanium concentration of about 30% was formed.

DESCRIPTION OF THE REFERENCE NUMERALS

1. Silicon-containing substrate
2. Silicon germanium layer (Si—Ge layer)
3. Aluminum-silicon germanium layer (Al—Si—Ge layer)
4. Aluminum germanium sintered body layer (Al—Ge sintered body layer)

The invention claimed is:

1. A paste composition for forming a silicon germanium layer, the composition comprising aluminum, germanium and resin component, wherein the germanium is in a form of a germanium powder having a germanium purity of 98.0 mass % or more, the content of the germanium is more than 1 part by mass and 10000 parts by mass or less, per 100 parts by mass of the aluminum, and the content of the resin component is 0.1 to 10 parts by mass, per 100 parts by mass of the aluminum.

2. The paste composition according to claim 1, which further comprises a glass component.

3. The paste composition according to claim 2, wherein the content of the glass component is 0.01 to 3 parts by mass, per 100 parts by mass of the aluminum.

4. A method for forming a silicon germanium layer, the method comprising the steps of:
   (1) step 1 of applying a paste composition to a silicon-containing substrate, the paste composition comprising aluminum, germanium and resin component, wherein the germanium is in a form of a germanium powder having a germanium purity of 98.0 mass % or more, the content of the germanium is more than 1 part by mass and 10000 parts by mass or less, per 100 parts by mass of the aluminum, and the content of the resin component is 0.1 to 10 parts by mass, per 100 parts by mass of the aluminum; and
   (2) step 2 of sintering the silicon-containing substrate to which the paste composition is applied.

5. The method according to claim 4, wherein the sintering is performed at a temperature of 500 to 1000° C.

* * * * *